(12) United States Patent
Machida et al.

(10) Patent No.: US 6,661,027 B1
(45) Date of Patent: Dec. 9, 2003

(54) SEMICONDUCTOR DEVICE AND ITS MANUFACTURING METHOD

(75) Inventors: Akio Machida, Kanagawa (JP); Dharam Pal Gosain, Kanagawa (JP); Takashi Noguchi, Kanagawa (JP); Setsuo Usui, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/718,269

(22) Filed: Nov. 22, 2000

(30) Foreign Application Priority Data

Nov. 25, 1999 (JP) .......................................... P11-334978

(51) Int. Cl.[7] .............................................. H01L 27/15
(52) U.S. Cl. ........................................ 257/79; 257/85
(58) Field of Search ............................. 257/88, 79, 80, 257/85; 438/22

(56) References Cited

U.S. PATENT DOCUMENTS 5,757,537 A * 5/1998 Elli, Jr. et al. ............... 359/268
6,136,161 A * 10/2000 Yu et al. .................. 204/192.29
6,268,558 B1 * 7/2001 Kubota ........................ 136/244
6,326,644 B1 * 12/2001 Lee et al. ...................... 257/91

* cited by examiner

Primary Examiner—David Nelms
Assistant Examiner—Thao Le
(74) Attorney, Agent, or Firm—Sonnenschein, Nath & Rosenthal LLP

(57) ABSTRACT

For manufacturing a semiconductor device, such as thin-film solar battery, comprising a base body made of an organic high polymer material, an oxide electrode film and semiconductor thin film each containing at least one kind of group IV elements on the oxide electrode film, one of the semiconductor thin films in contact with the oxide electrode film is stacked by sputtering in a non-reducing atmosphere such as atmosphere not containing hydrogen gas, for example. Thereby, it is ensured that granular products as large as and beyond 3 nm are not contained substantially at the interface between the oxide electrode film and that semiconductor thin film. Therefore, a semiconductor thin film such as amorphous semiconductor thin film can be stacked with enhanced adherence on a plastic substrate having an oxide electrode film like ITO film on its surface.

17 Claims, 5 Drawing Sheets a-Si:H/ITO/SiOx/PET a-Si:H  PE-CVD SiH4/H2 50sccm 200mTorr
Ts = 120° C   RF power 20W a-Si/ITO/SiOx/PET a-Si  DC sputter Ar 50sccm 5mTorr
Ts = 80° C   DC power 1000W

SEMICONDUCTOR DEVICE AND ITS MANUFACTURING METHOD

BACKGROUND OF THE INVENTION

1. Field of the Invention

This invention relates to a semiconductor device and its manufacturing method and, more particularly, to a semiconductor device using a plastic substrate suitable for application to a thin-film solar battery, for example.

2. Description of the Related Art

In case of using fossil fuel like coal and petroleum as an energy source, carbon dioxide as its exhaust product is considered to invite global warming. Using an atomic energy involves a danger of radioactive contamination. In these days where environmental issues are being discussed, it is not desirable to rely on these energies.

Solar batteries that are photoelectric conversion elements for converting sunlight to electric energy have almost no effects on the earth environment, and their further diffusion is anticipated. Currently, however, there are some problems that disturb their diffusion.

There are a lot of materials of solar batteries. Among them, solar batteries using silicon are commercially available. They are generally classified to crystalline silicon solar batteries using mono-crystalline silicon or polycrystalline silicon and amorphous silicon solar batteries. Heretofore, mono-crystalline or polycrystalline silicon has been often used for solar batteries. However, although these crystalline silicon solar batteries have a higher conversion efficiency that indicates the performance of converting photo (solar) energy into electric energy than amorphous silicon, much energy and time were required for crystalline growth. Therefore, it was difficult to mass-produce them and provide them inexpensively.

Amorphous silicon solar batteries currently have a lower conversion efficiency than crystalline silicon solar batteries. However, they have advantageous features, such as the need for only a small thickness of less than one hundredth of the thickness that a crystalline silicon solar battery needs for photoelectric conversion, which exhibits a high photo absorption property of amorphous silicon solar batteries and enables formation of a solar battery by stacking a relatively thin film; the capability of selecting as a substrate various materials like glass, stainless steel, polyimide plastic films, and so on, making use of the amorphous quality; readiness of making a battery of a much larger extension; and so on. Furthermore, it is considered that the manufacturing cost can be lowered than that of crystalline silicon solar batteries, and future diffusion over a wide range from the home use level to a large-scaled power plant level is anticipated.

In the structure of an amorphous silicon solar battery, development of CVD technologies has made it possible to produce cells by sequentially stacking semiconductor thin films of desired compositions and thicknesses. In general, often used cells have a structure having a potential gradient from the photo detecting surface to the back surface, which is made by sequentially stacking on a substrate of glass, for example, n-type hydrogenated amorphous silicon (hereinafter called "a-Si:H") thin film containing phosphorus, a [p-type] i-type a-Si:H thin film containing no impurity, and a p-type a-Si:H thin film containing boron.

In addition to such structure having a potential gradient produced by impurities, also known are hetero junction type solar battery cells that have a structure including a multi-layered film made by stacking two or more kinds of semiconductor materials different in band gap and are capable of efficient photoelectric conversion matching with different wavelengths, as a technology for fabricating a high-efficiency amorphous solar battery.

Regarding hetero junction type solar battery cells, there is a trial of effectively using light by employing hydrogenated amorphous silicon germanium (hereinafter called "a-SiGe:Hn") thin film, for example. This a-Site:H has a high photo absorptance, and allows an increase in short-circuit current. However, since a-SiGe:H has more levels in a band gap than a-Si:H, it has the drawback that slope factors decrease. Thus, the band gap is continuously changed by changing the composition ratios of a-SiGe:H, a-Si:H or the like of the i-type layer, to overcome those drawbacks. In case of this structure, as the minimum value portion of the band gap of the i-type layer comes closer to the p-type layer on the part of incidence of light, light deteriorates less and the device can be improved in reliability. This is because along with an increase of the photo absorption distribution near the p-type layer, collection of holes is improved more. However, making the minimum band gap portion near the p-type layer involved the problem that the band gap of the i-type layer near the p-type layer became smaller and rendered the open circuit voltage lower. Further, although this method decreases the band gap of the i-type layer and increases the optical absorption, decreasing the band gap of the i-type layer to about 1.4 eV or less causes slope factors to decrease, and the efficiency is not improved even with an increase of the amount of photo absorption. Furthermore, there is known the method of interposing hydrogenated amorphous silicon carbide (hereinafter called a-SiC:H) film having a wide gap around 2.1 eV between the p-type layer and the i-type layer for the purpose of further improving the open circuit voltage.

On the other hand, an amorphous film fabricated at a substrate temperature of or below 200° C. contains a number of elements like local energy levels in the energy band gap, which can be nucleus of recombination of minority carriers, and its carrier length is shorter than those of single crystals and polycrystals. If the dark conductivity becomes small in doped a-Si:H, a-SixGe1-x:H, a-Ge:H, a-SiC:H and other like films, conversion efficiency of solar batteries using these films as their p-type layers and/or n-type layers of pin diodes forming the solar batteries become lower, and this is a bar to fabrication of high-quality solar batteries at low temperatures. However, also proposed is the technology of increasing the dark conductivity by using laser annealing which crystallizes only p-type layers and/or n-type layers of pin diodes while keeping substrates at lower temperatures.

Appropriate combination of these technologies is expected to improve the efficiency of amorphous silicon solar batteries, and further diffusion of amorphous silicon solar batteries in the future is anticipated also from the standpoint of their manufacturing cost.

In order to provide for various future uses of solar batteries for wide-spreading amorphous silicon solar batteries, decreasing the weight of products, improvement of their productivity, reduction of the curvature processing cost, and others, are required. Many of materials having low melting points and plastic materials can be configured into desired shapes at low temperatures, and are therefore advantageous in readiness to reduce the processing cost. Plastic materials have further advantages that products are light and not fragile. Therefore, it is desirable to make high-quality amorphous silicon solar batteries or hetero junction type solar batteries on substrates of those materials.

If plastics, especially general-purpose plastics like polyester films, can be employed as base bodies, those requirements can be met in combination with roll-to-to-roll production facilities using elongated base bodies.

However, when films are stacked on a plastic substrate, the substrate is liable to curve or warp after growth of the films due to a stress in films caused by difference in thermal expansion coefficient between the plastic and films, swelling of the plastic, and so on. In this case, if the films grown on the plastic substrate insufficiently adhere one another, films will peel off at their boundaries. Additionally, although the stress of the films exerted to the substrate can be relaxed by simultaneously stacking films on opposite surfaces of the substrate, if the films do not adhere well, it is not possible to make the most of flexibility of the plastic.

Plasma CVD has been typically used heretofore as a technology for fabricating photovoltaic devices using amorphous silicon films or other like films. Plasma CVD typically uses SiH4 as the source material gas. In the case where the film is stacked on ITO as a transparent electrode by plasma enhanced CVD (PE-CVD) using SiH4, SiH4 gas is decomposed in the plasma into hydrogen ions and damages the ITO surface. In case of a solar battery using a conventional glass substrate, the substrate does not warp with a stress of the film after deposition of the film, and the solar battery is not bent in practical use. Therefore, separation of the substrate and the film did not occur. A plastic substrate, however, warps with a stress from a film after deposition of the film. An a-Si film stacked thereon will undesirably peel off at the boundary with ITO.

Taking account of photovoltaic property of a film and its deposition rate, deposition of a film by PE-CVD is indispensable, and this is very serious problem upon fabricating a solar battery on a plastic substrate.

Toward a solution of the above-indicated problems involved in the conventional techniques, the Inventor made various researches that are summarized below.

As already explained, conventional manufacturing method of photovoltaic devices using amorphous silicon films, or the like, usually provide very good thin films if the films are stacked by using plasma CVD.

There is also a deposition method by sputtering as one-of deposition methods of amorphous silicon films. In case of stacking a film by plasma CVD, since it uses SiH4 as the source material gas, it inevitably exposes the substrate surface to H2 plasma. However, sputtering is conducted without introducing H2 gas, this problem can be avoided.

OBJECTS AND SUMMARY OF THE INVENTION

This invention has been made through further researches by the Inventor based on the knowledge reviewed above.

To attain the above-indicated object, according to the first aspect of the invention, there is provided a semiconductor device comprising:

a base body made of an organic high polymer material;

an oxide electrode film on the base body; and a semiconductor thin film on the oxide electrode film, which contains at least one kind of group IV elements, wherein no granular products each having a diameter not smaller than 3 nm are substantially contained at the boundary between the oxide electrode film and the semiconductor thin film.

From the viewpoint of further improving the adherence between the oxide electrode film and the semiconductor thin film, it is preferable that the boundary between the oxide electrode film and the semiconductor thin film does not contain granular products with a diameter not smaller than 1 nm.

According to the second aspect of the invention, there is provided a semiconductor device comprising:

a base body made of an organic high polymer material;

an oxide electrode film on the base body; and a semiconductor thin film on the oxide electrode film, which contains at least one kind of group IV elements, wherein the semiconductor thin film is stacked in a non-reducing atmosphere in an initial period of deposition thereof.

According to the third aspect of the invention, there is provided a manufacturing method of a semiconductor device having a base body made of an organic high polymer material; an oxide electrode film on the base body; and a semiconductor thin film on the oxide electrode film, which contains at least one kind of group IV elements, comprising:

a step of stacking the semiconductor thin film in a non-reducing atmosphere in an initial period of deposition thereof.

In the present invention, the base body is typically a transparent base body, and more specifically, a film of a transparent organic high polymer material such as polyester (PET), for example, is used. The oxide electrode film is typically a transparent electrode film, and more specifically, it is, for example, ITO (indium tin oxide), tin oxide, tin oxide doped with fluoric acid, zinc oxide, zinc oxide-aluminum oxide, or the like.

In the first aspect of the invention, a portion of the semiconductor thin film near the boundary between the oxide electrode film and the semiconductor thin film is preferably stacked in a non-reducing atmosphere, and more particularly, in an atmosphere not containing hydrogen gas. Typically, the portion of the semiconductor thin film near the boundary between the oxide electrode film and the semiconductor thin film is stacked by sputtering not using hydrogen gas, and at least another portion of the semiconductor thin film is stacked by plasma enhanced chemical vapor deposition (PE-CVD).

In the present invention, the semiconductor thin film is typically an amorphous semiconductor thin film, and more specifically, it is a hydrogenated amorphous silicon, a hydrogenated amorphous germanium, a hydrogenated amorphous silicon germanium, a hydrogenated amorphous silicon carbide.

In the present invention, the semiconductor device may basically be any that uses a semiconductor thin film. Specifically, however, it is a thin film photovoltaic device, for example, and more particularly, a thin film solar battery, for example.

According to the first aspect of the invention having the above-summarized structure, since the boundary between the oxide electrode film and the semiconductor thin film does not contain granular products having a diameter of 3 nm or larger, their adherence is improved. Therefore, when using a base body of a general-purpose plastic like a polyester film having formed thereon an oxide electrode film like ITO, and stacking thereon a semiconductor thin film by PE-CVD using a source material gas containing hydrogen, the semiconductor thin film can be effective prevented from peeling off from the base body even if the base body curves or warps after deposition of the film.

According to the second and third aspects of the invention arranged as summarized above, by stacking the semiconductor thin film in a non-reducing atmosphere in an initial period of deposition, it is ensured that no granular products having a diameter of 3 nm or larger are contained at the boundary between the oxide electrode film and the semiconductor thin film, and their adherence is improved. Therefore, when using a base body of a general-purpose plastic like a polyester film having formed thereon an oxide electrode film like ITO, and stacking a semiconductor thin film by PE-CVD using a source material gas containing hydrogen, the semiconductor thin film can be effective prevented from peeling off from the base body even if the base body curves or warps after deposition of the film.

DETAILED DESCRIPTION OF THE PREFERRED EMBODIMENTS

Explained below are embodiments of the invention with reference to the drawings.

Figure 1:
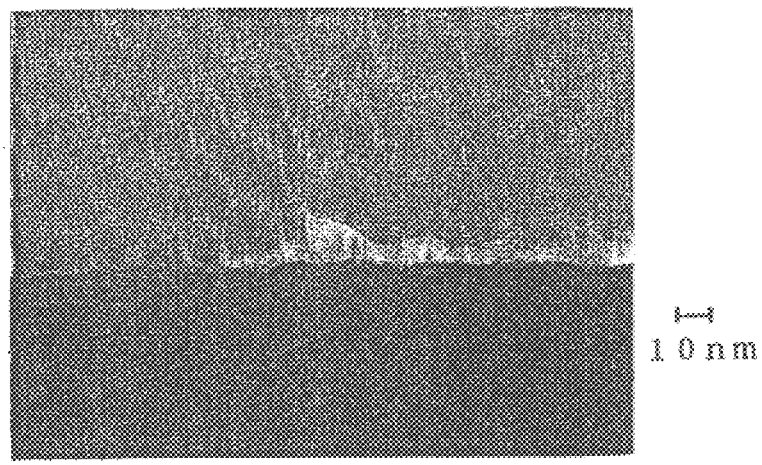
FIG. 1 is a transmission type electron microscopic image of a region near the Si:H/ITO boundary of a sample prepared by stacking an a-Si:H film by PE-CVD on an ITO Film stacked on a PET substrate via a SiOx film.
Figure 2:
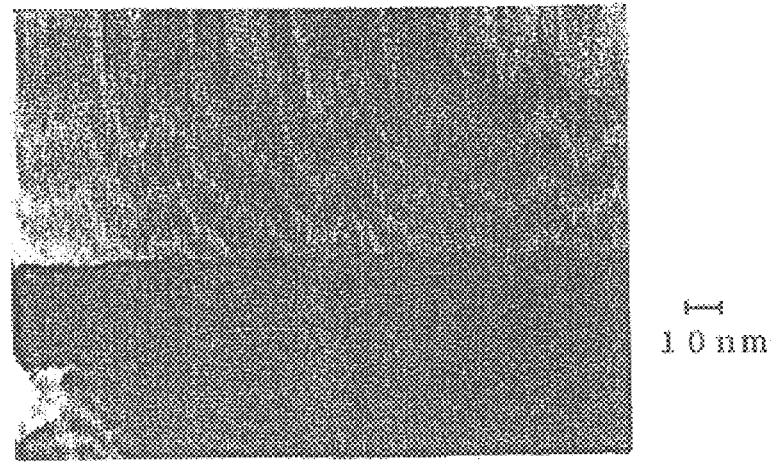
FIG. 2 is a transparent electron microscopic image of a region near the a-Si/ITO boundary of a sample prepared by stacking an a-Si film by DC sputtering using only Ar gas without using H2 gas on an ITO film stacked on a PET substrate via a SiOx film.

FIG. 1 shows a transmission type electron microscopic (TEM) image of a region distant by about 20 nm in the vertical direction from ITO near the a-Si:H/ITO boundary of a sample prepared by stacking an a-Si:H film by PE-CVD on an ITO film stacked on a PET substrate via a SiOx film. PE-CVD of the a-Si:H film was conducted by flowing 50 sccm of SiH4/H2 gas under the pressure of 200 mTorr, setting temperature so that the substrate temperature Ts is 120° C. and the RF power to 20 W. FIG. 2 shows a TEM image of a region distant by about 20 nm in the vertical direction from ITO near the a-Si/ITO boundary of a sample prepared by stacking an a-Si film by DC sputtering using Ar gas alone without using H2 gas on an ITO film stacked on a PET substrate via a SiOx film. DC sputtering of the a-Si film was conducted by flowing 50 sccm of Ar gas under the pressure of 5 mTorr, setting temperature so that the substrate temperature Ts is 80° C. and the DC power to 1000W.

Referring to FIG. 1, at the boundary between the a-Si:H film by PE-CVD and ITO, peeling is observed locally, and a region is observed where a granular products precipitated at the boundary. As a result of analysis through TEM-EDX, this region was confirmed to be a compound of In and Sn, and the surface of ITO film reduced and fragile was confirmed to have locally peeled off. From TEM observation, the Inventor is aware that, when granular products with diameters of and longer than 4 nm exist at the boundary, peeling of the film becomes conspicuous. On the other hand, observing FIG. 2, peeling did not occur at the boundary between the a-Si film by sputtering and ITO. This would be because H2 gas is not introduced during deposition by sputtering, the ITO surface is not exposed to hydrogen ion plasma, and the film is stacked without damaging the surface of the ITO film. According to the knowledge obtained through TEM observation, no granular products with diameters of 3 nm or more were not observed at the boundary.

Figure 3:
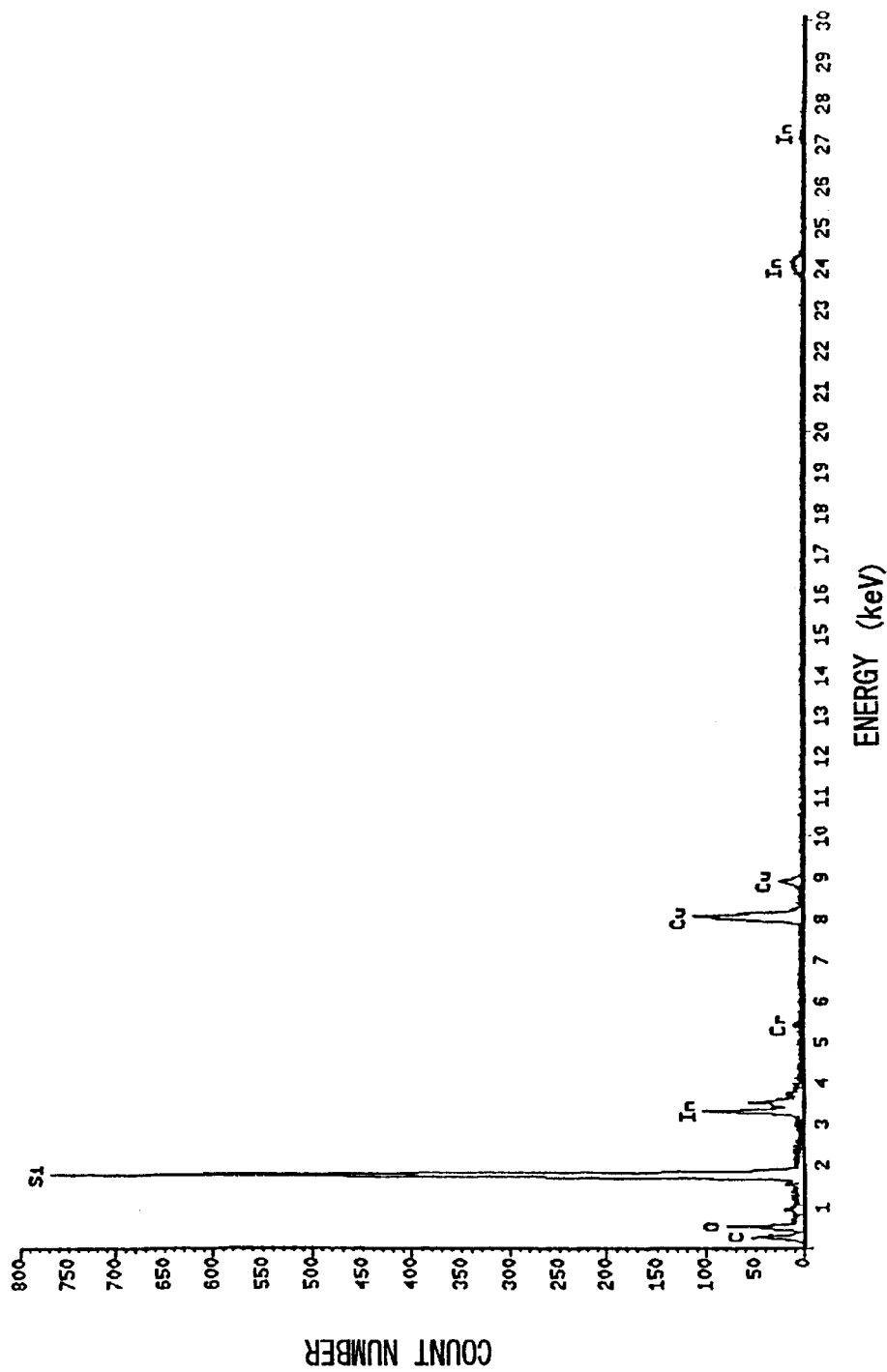
FIG. 3 is a schematic diagram showing a result of TEM-EDX measurement of the sample shown in FIG. 1.
Figure 4:
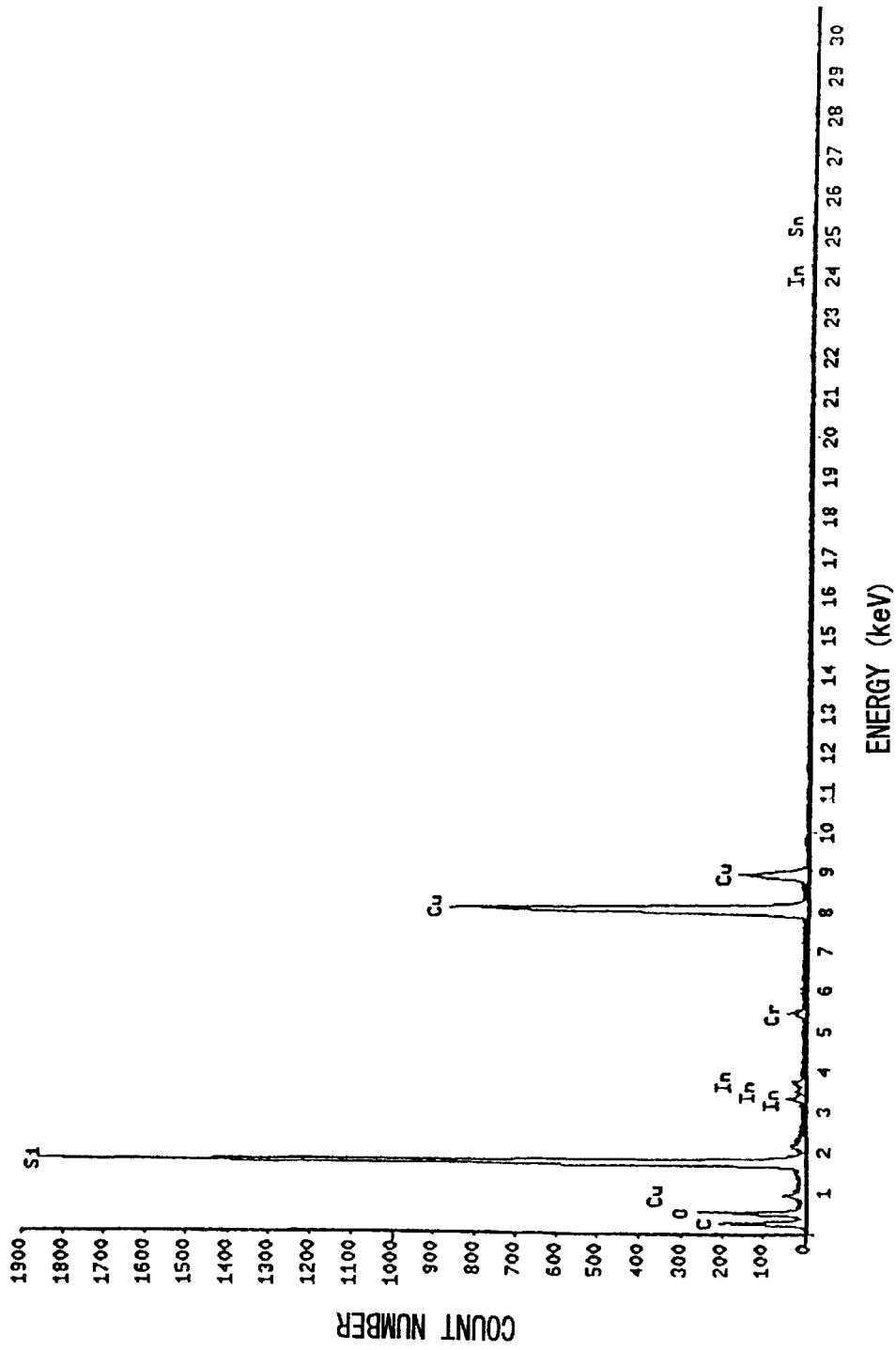
FIG. 4 is a schematic diagram showing a result of TEM-EDX measurement of the sample shown in FIG. 1.

FIGS. 3 and 4 show result of TEM-EDX measurement of the sample shown in FIG. 1. In this TEM-EDX, acceleration voltage is about 200 kV, and the beam diameter is 1 nm. FIG. 3 shows a result with relatively large globular products (having a diameter of about [222] 22 nm) which lay apart from ITO (by a vertical distance around 20 nm), and FIG. 4 shows a result with relatively small globular products (having a diameter of about 2 nm) which fully peeled off from ITO. Substantial resolution of this TEM-EDX is considered to have an extension of a beam diameter not less than 1 nm. In FIG. 3, the reason why many peaks of Si were detected from globular products with a diameter of about 22 nm presumably lies in that the acceleration voltage was as high as 200 kV, and there was a high possibility that a lot of information in the depth direction entered, and it did not mean mixture of Si into the globular products. In FIGS. 3 and 4, peaks of Cu are considered to have been made by Cu in TEM sample holders (mesh), peaks of Cr are considered to have been made by a small amount of Cr contained in ITO films, and peaks of C and O are considered to have been made by impurities absorbed from the atmospheric air during handling of the samples.

As reviewed above, by stacking an a-Si film by DC sputtering on the ITO film surface on a plastic substrate without using H2 gas, it is possible to prevent that granular products, particularly with a diameter around 4 nm, which cause peeling of films are produced at the boundary with the base ITO film. More specifically, upon stacking a film of a-Si:H on an ITO film surface of a plastic substrate, such an a-Si film by sputtering as a buffer layer largely improves the adherence. While the a-Si:H film is stacked by PE-CVD on a non-hydrogenated a-Si film, the non-hydrogenated a-Si film is [A non-hydride a-Si film is] hydrogenated into a-Si:H film by hydrogen supplied from the a-Si:H film. However, it can be hydrogenated into a-Si:H by diffusing hydrogen later, namely, by first stacking the a-Si film and thereafter annealing the entirety in a hydrogen gas atmosphere.

This is effective also when an a-Si:H film is stacked on a plastic substrate having formed thereon an oxide electrode material other than ITO, such as a film of tin oxide, tin oxide doped with fluoric acid, zinc oxide, or the like. This also applies not only to a-Si:H but also to a-Ge:H, a-SiGe:H, and so forth. More generally, it applies to any semiconductor thin films containing at least one kind of group IV elements.

Figure 5:
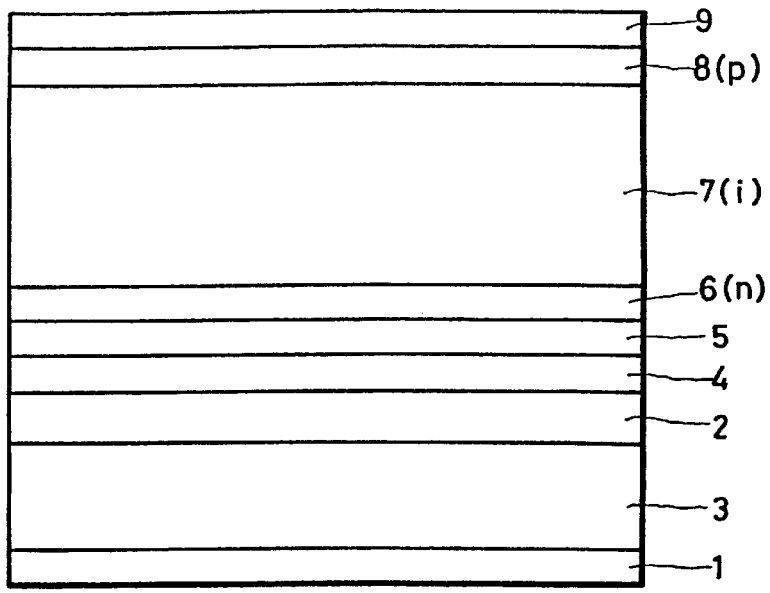
FIG. 5 is a cross-sectional view of a thin-film solar battery according to the first embodiment of the invention.

FIG. 5 shows a thin-film solar battery according to the first embodiment of the invention.

As shown in FIG. 5, in the thin-film solar battery, a transparent inorganic buffer layer 4, transparent electrode film 5, n-type amorphous semiconductor film 6, i-type amorphous semiconductor film 7, p-type amorphous semiconductor film 8 and bottom metal reflecting film 9 are sequentially stacked on a transparent organic buffer layer 2 on a transparent plastic base body 3 whose opposite surfaces are hard-coated by a transparent organic protection film 1 and the transparent organic buffer layer 2.

The transparent organic protection film and the transparent organic buffer layer 2 are of acrylic resin, for example. The transparent plastic base body 3 is film-like PET substrate, for example. The transparent electrode layer 5 is made of ITO, for example. The n-type amorphous semiconductor film 6, i-type amorphous semiconductor film 7 and p-type amorphous semiconductor film 8 are made of group IV semiconductors, such as Si. The bottom metal reflecting film 9 is made of Al, for example.

A feature of the thin-film solar battery lies in having substantially no granular products made of component elements of the transparent electrode film 5, or other elements, having diameters of 3 nm or larger, and preferably diameters of 1 nm or larger.

Next explained is a specific example of manufacturing method of the thin-film solar battery having the above-explained structure.

First, as the transparent plastic base body 3 having formed the transparent organic protection film 1 and the transparent organic buffer layer 2 on opposite surfaces, there is used a punched-out piece with the diameter of 4 inches from a 200 ?m thick PET substrate, for example, having opposite surfaces hard-coated with acrylic resin, and it is washed.

After that, this PET substrate is set in a vacuum chamber of a sputtering apparatus, and the chamber is evacuated into about 10–7 Torr by using a vacuum pump. Subsequently, a silicon oxide (SiOx) film is stacked as the inorganic transparent buffer layer 4 on the PET substrate by sputtering. Further, in a similar way, an ITO film is stacked as the transparent electrode 5 by sputtering. In both these steps, Ar gas is used.

After that, Ar is supplied by 30 sccm, pressure upon electric discharge is set at 3 mTorr, temperature is set so that the substrate surface temperature is 120° C., plasma is generated with 1000 W, and DC sputtering is conducted by using a target substrate of Si doped with phosphorus to stack a phosphorus-doped n-type a-Si film that is 30 nm thick, for example, as the n-type amorphous semiconductor film 6. In this process, the n-type a-Si film on the transparent electrode film 5 is stacked by DC sputtering not using H2 gas, and therefore, it is prevented that granular products with diameters of and longer than 1 nm containing In or Sn as their major component are produced at the boundary between the transparent electrode film 5 as the ITO film and the n-type a-Si film.

After that, in order not to expose the substrate to the atmospheric air, the substrate is transported into the PE-CVD chamber by a loadlock. Subsequently, after setting SiH4 (10%)/H2 to 50 sccm, pressure during electric discharge to 200 mTorr and temperature of the substrate surface to 120° C., and generating plasma with the power of 20 W, an i-type a-Si:H film, which is 50 nm thick, for example, is stacked as the i-type amorphous semiconductor film 7 on the n-type a-Si film by PE-CVD. Since the thick I-type a-Si:H film used as a photoelectric conversion layer is stacked by PE-CVD, a high deposition rate can be obtained, and the time required for deposition is reduced. The n-type a-Si film as the n-type amorphous semiconductor film 6 is hydrogenated into the n-type a-Si:H film by hydrogen supplied from the i-type a-Si:H film during deposition of the i-type a-Si:H film on the n-type a-Si film by PE-CVD.

After that, the substrate is again transported into the vacuum chamber of the sputtering apparatus by the loadlock. Then, setting Ar to 30 sccm, pressure during electric discharge to 3 mTorr, and temperature of the substrate surface to 120° C., generating plasma with 1000 W, and DC-sputtering a phosphorus-doped Si target substrate, a phosphorus-doped p-type a-Si film, which is 30 nm thick, for example, is stacked as the p-type amorphous semiconductor film 8 on the I-type a-Si:H film.

After that, the substrate is again transported into the vacuum chamber of the sputtering apparatus by the loadlock. Then, supplying Ar by 30 sccm onto the p-type a-Si:H film, setting the pressure during electric discharge to 3 mTorr and the temperature of the substrate surface to 120° C., generating plasma with 1000 W, and DC-sputtering an Al target substrate, an Al film, 100 nm thick, for example, is stacked as the bottom metal reflection film 9.

Through these steps, the intended thin-film solar battery is completed.

As explained above, according to the first embodiment, since the n-type amorphous semiconductor film 6 on the transparent electrode film 5 is stacked by DC sputtering not using H2 gas, it is prevented that granular products with diameters of and larger than 1 nm at their boundary, and therefore, adherence of the n-type amorphous semiconductor film 6 to the transparent electrode 5 can be enhanced. As a result, even if the transparent plastic base body 3 curves or warps after deposition of films, separation at the boundary between the transparent electrode film 5 and the n-type amorphous semiconductor film 6 can be effectively prevented. Thereby, it is possible to realize an amorphous thin-film solar battery using a transparent plastic base body 3, which is flexible, light, inexpensive, reliable and efficient.

Next explained is a thin-film solar battery according to the second embodiment of the invention.

The second embodiment uses an i-type a-SixGe1-x:H (0<x?1) film as the i-type amorphous semiconductor film 7 in the first embodiment. In the other respects, it is the same as the first embodiment.

The manufacturing method of the thin-film solar battery according to the second embodiment is the same as the manufacturing method of the thin-film solar battery according to the first embodiment except for the deposition of the i-type amorphous semiconductor film 7. The i-type a-SixGe1-x:H film as the i-type amorphous semiconductor film 7 is stacked in the following manner, for example. That is, supplying GeH4(10%)/H2 and SiH4 (10%)H2, onto the n-type a-Si film, setting the pressure during electric discharge to 200 mTorr and the temperature of the substrate surface to 120° C., and thereafter generating plasma with the power of 20 W, a non-doped i-type a-SixGe1-x:H (0<x?1) film, which is 500 nm thick, for example, is stacked on the n-type Si:H film. In this process, the flow rate ratio between the GeH4(10%)/H2 and SiH4 (10%)/H2 is gradually changed from the start of deposition so that the ratio of x in the a-SixGe1–x:H (0<?) gradually becomes larger from the substrate side, and from the mid course, SiH4 (10%)/H2 is not supplied.

The second embodiment also has the same advantages as the first embodiment.

Figure 6:
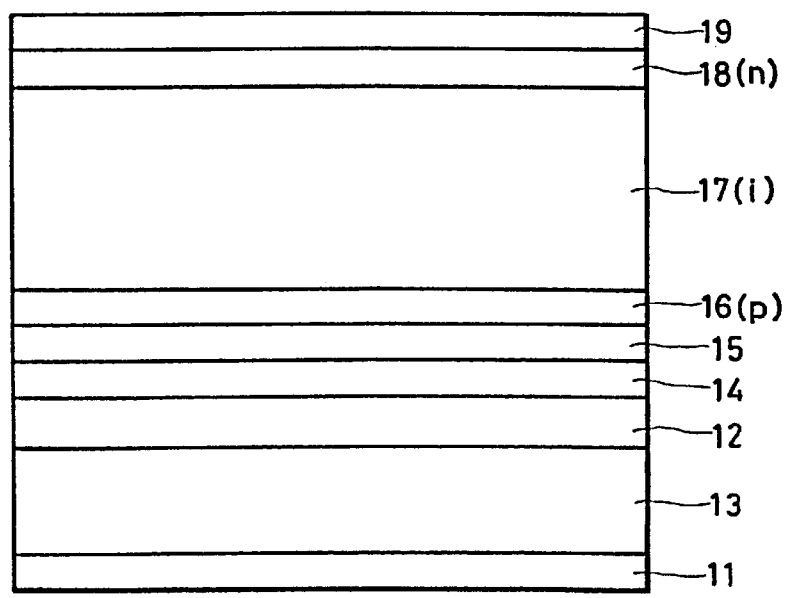
FIG. 6 is a cross-sectional view of a thin-film solar battery according to the third embodiment of the invention.

FIG. 6 shows a thin-film solar battery according to the third embodiment of the invention.

As shown in FIG. 6, in the thin-film solar battery, a transparent inorganic buffer layer 14, transparent electrode film 15, p-type amorphous semiconductor film 16, i-type amorphous semiconductor film 17, n-type amorphous semiconductor film 18 and bottom metal reflecting film 19 are sequentially stacked on a transparent organic buffer layer 12 on a transparent plastic base body 13 whose opposite surfaces are hard-coated by a transparent organic protection film 11 and the transparent organic buffer layer 12.

The transparent organic protection film and the transparent organic buffer layer 12 are of acrylic resin, for example. The transparent plastic base body 13 is file-like PET substrate, for example. The transparent electrode layer 15 is made of ITO, for example. The p-type amorphous semiconductor film 16, i-type amorphous semiconductor film 17 and n-type amorphous semiconductor film 18 are made of group IV semiconductors, such as Si. The bottom metal reflecting film 19 is made of Al, for example.

A feature of the thin-film solar battery lies in having substantially no granular products made of component elements of the transparent electrode film 15, or other elements, having diameters of 3 nm or larger, and preferably diameters of 1 nm or larger.

Next explained is a specific example of manufacturing method of the thin-film solar battery having the above-explained structure.

First, as the transparent plastic base body 13 having formed the transparent organic protection film 11 and the transparent organic buffer layer 12 on opposite surfaces, there is used a punched-out piece with the diameter of 4 inches from a 200 ?m thick PET substrate, for example, having opposite surfaces hard-coated with acrylic resin, and it is washed.

After that, this PET substrate is set in a vacuum chamber of a sputtering apparatus, and the chamber is evacuated into about 10–7 Torr by using a vacuum pump. Subsequently, a SiOx film is stacked as the inorganic transparent buffer layer 13 on the PET substrate by sputtering. Further, in a similar way, an ITO film is stacked as the transparent electrode 15 by sputtering. In both these steps, Ar gas is used.

After that, Ar is supplied by 30 sccm, pressure upon electric discharge is set at 3 mTorr, temperature is set so that the substrate surface temperature is 120° C., plasma is generated at 1000 W, and DC sputtering is conducted by using a target substrate of Si doped with boron to stack a boron-doped p-type a-Si film that is 30 nm thick, for example, as the p-type amorphous semiconductor film 16. In this process, the p-type a-Si film on the transparent electrode film 15 is stacked by DC sputtering not using H2 gas, and therefore, it is prevented that granular products with diameters of and longer than 1 nm containing In or Sn as their major component are produced at the boundary between the transparent electrode film 15 as the ITO film and the p-type a-Si film.

After that, the substrate is transported into the PE-CVD chamber by a loadlock. Subsequently, after setting SiH4 (10%)/H2 to 50 sccm, pressure during electric discharge to 200 mTorr and temperature of the substrate surface to 120° C., and generating plasma with the power of 20 W, an i-type a-Si:H film, which is 50 nm thick, for example, is stacked as the i-type amorphous semiconductor film 17 on the p-type a-Si film. The p-type a-Si film as the p-type amorphous semiconductor film 16 is hydrogenated into the p-type a-Si:H film by hydrogen supplied from the i-type a-Si:H film during deposition of the i-type a-Si:H film on the p-type a-Si film by PE-CVD.

Subsequently, supplying SiH4 (10%)/H2 by 50 sccm and PH3 (1%)/H2 by 50 sccm, setting the pressure during electric discharge to 200 mTorr and the substrate surface temperature to 120° C., and generating plasma with the power of 20 W, a phosphorus-doped n-type a-Si:H film, which is 30 nm thick, for example, is stacked as the n-type amorphous semiconductor film 18.

After that, the substrate is again transported into the vacuum chamber of the sputtering apparatus by the loadlock. Then, supplying Ar by 30 sccm onto the p-type a-Si:H film, setting the pressure during electric discharge to 3 mTorr and the temperature of the substrate surface to 120° C., generating plasma with 1000 W, and DC-sputtering an Al target substrate, an Al film, 100 nm thick, for example, is stacked as the bottom metal reflection film 19.

Through these steps, the intended thin-film solar battery is completed.

As explained above, according to the first embodiment, since the p-type amorphous semiconductor film 16 on the transparent electrode film 15 is stacked by DC sputtering not using H2 gas, it is prevented that granular products with diameters of and larger than 1 nm, or 3 nm, at their boundary, and therefore, adhesion of the p-type amorphous semiconductor film 16 to the transparent electrode 15 can be enhanced. As a result, even if the transparent plastic base body 13 curves or warps after deposition of films, separation at the boundary between the transparent electrode film 15 and the p-type amorphous semiconductor film 16 can be effectively prevented. Thereby, it is possible to realize an amorphous thin-film solar battery using a transparent plastic base body 13, which is flexible, light, inexpensive, reliable and efficient.

Figure 7:
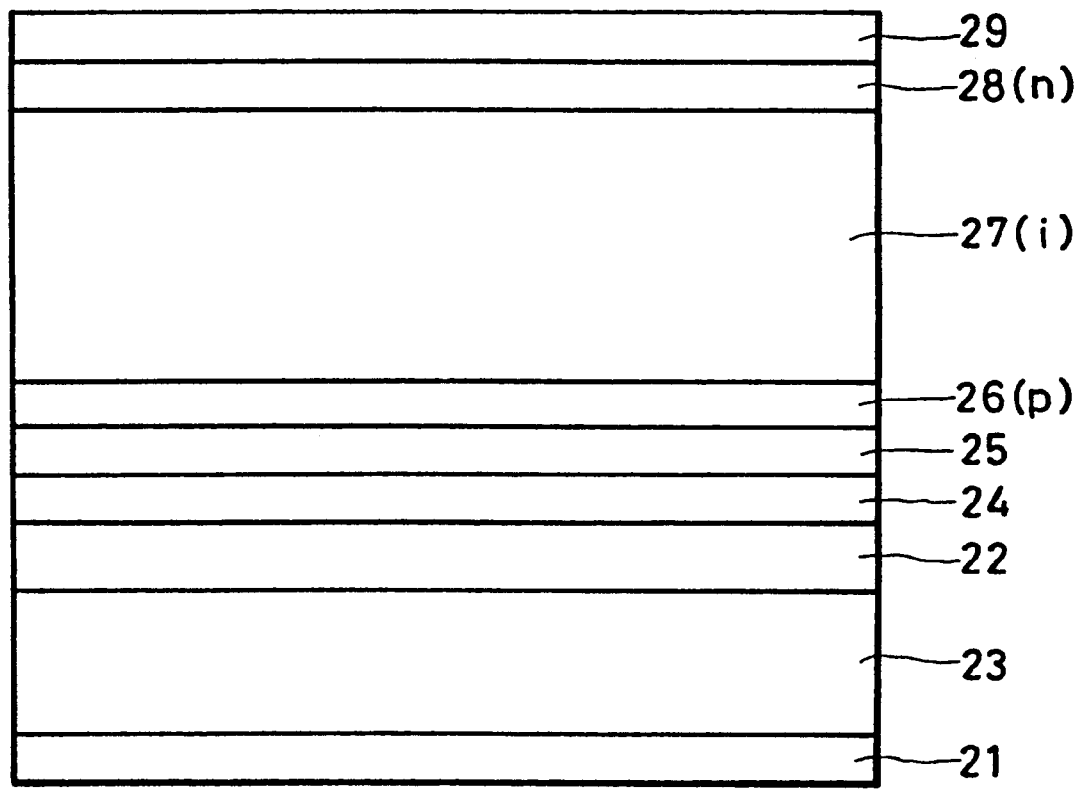
FIG. 7 is a cross-sectional view of a thin-film solar battery according to the fourth embodiment of the invention.

FIG. 7 shows a thin-film solar battery according to the fourth embodiment of the invention.

As shown in FIG. 7, in the thin-film solar battery, a transparent inorganic buffer layer 24, transparent electrode film 25, p-type amorphous semiconductor film 26, i-type amorphous semiconductor film 27, n-type amorphous semiconductor film 28 and bottom metal reflecting film 29 are sequentially stacked on a transparent organic buffer layer 22 on a transparent plastic base body 23 whose-opposite surfaces are hard-coated by a transparent organic protection film 21 and the transparent organic buffer layer 22.

The transparent organic protection film and the transparent organic buffer layer 22 are of acrylic resin, for example. The transparent plastic base body 23 is file-like PET substrate, for example. The transparent electrode layer 25 is made of ITO, for example. The p-type amorphous semiconductor film 26 is made of SiC, which is a group IV semiconductor, and the i-type amorphous semiconductor film 27 and n-type amorphous semiconductor film 28 are made of Si, which is a group IV semiconductor. The bottom metal reflecting film 29 is made of Al, for example.

A feature of the thin-film solar battery lies in having substantially no granular products made of component elements of the transparent electrode film 25, or other elements, having diameters of 3 nm or larger, and preferably diameters of 1 nm or larger.

Next explained is a specific example of manufacturing method of the thin-film solar battery having the above-explained structure.

First, as the transparent plastic base body 23 having formed the transparent organic protection film 21 and the transparent organic buffer layer 22 on opposite surfaces, there is used a punched-out piece with the diameter of 4 inches from a 200 ?m thick PET substrate, for example, having opposite surfaces hard-coated with acrylic resin, and it is washed.

After that, this PET substrate is set in a vacuum chamber of a sputtering apparatus, and the chamber is evacuated into about 10–7 Torr by using a vacuum pump. Subsequently, a SiOx film is stacked as the inorganic transparent buffer layer 13 on the PET substrate by sputtering. Further, in a similar way, an ITO film is stacked as the transparent electrode 15 by sputtering. In both these steps, Ar gas is used.

After that, Ar is supplied by 30 sccm, pressure upon electric discharge is set at 3 mTorr, temperature is set so that the substrate surface temperature is 120° C., plasma is generated at 1000 W, and DC sputtering is conducted by using a target substrate of SiC doped with boron to stack a boron-doped p-type aSiC film that is 30 nm thick, for example, as the p-type amorphous semiconductor film 26. In this process, the p-type a-SiC film on the transparent electrode film 25 is stacked by DC sputtering not using H2 gas, and therefore, it is prevented that granular products with diameters of and longer than 1 nm containing In or Sn as their major component are produced at the boundary between the transparent electrode film 25 as the ITO film and the p-type a-SiC film.

After that, the substrate is transported into the PE-CVD chamber by a loadlock. Subsequently, after setting SiH4 (10%)/H2 to 50 sccm, pressure during electric discharge to 200 mTorr and temperature of the substrate surface to 120° C., and generating plasma with the power of 20 W, an i-type a-Si:H film, which is 50 nm thick, for example, is stacked as the i-type amorphous semiconductor film 17 on the p-type amorphous semiconductor film. The p-type a-SiC film as the p-type amorphous semiconductor film 26 is hydrogenated into the p-type a-Si:H film by hydrogen supplied from the i-type a-SiC:H film during deposition of the i-type a-Si:H film on the p-type a-Si film by PE-CVD Subsequently, supplying SiH4 (10%)/H2 by 50 sccm and PH3(1%)/H2 by 50 sccm, setting the pressure during electric discharge to 200 mTorr and the substrate surface temperature to 120° C., and generating plasma with the power of 20 W, a phosphorus-doped n-type a-Si:H film, which is 30 nm thick, for example, is stacked as the n-type amorphous semiconductor film 28.

After that, the substrate is again transported into the vacuum chamber of the sputtering apparatus by the loadlock. Then, supplying Ar by 30 sccm onto the p-type a-Si:H film, setting the pressure during electric discharge to 3 mTorr and the temperature of the substrate surface to 120° C., generating plasma with 1000 W, and DC-sputtering an Al target substrate, an Al film, 100 nm thick, for example, is stacked as the bottom metal reflection film 29.

Through these steps, the intended thin-film solar battery is completed.

The fourth embodiment also has the same advantages as those of the third embodiment. In addition to them, it is advantageous in providing a thin-film solar battery with a higher conversion efficiency because it uses the p-type a-SiC film, which is a wide-gap semiconductor, as the p-type amorphous semiconductor film 26, and allows light over a wider wavelength band to path through the p-type amorphous semiconductor film 26 and enter into the i-type amorphous semiconductor film 27.

Although the invention has been explained by way of specific examples, the invention is not limited to those embodiments, but include various changes and modifications within the technical concept of the invention.

For example, numerical values, structures, materials, substrates, source materials, processes, and so forth, which were raised in the description of the first, second, third and fourth embodiments, are not but mere examples, and therefore, any other appropriate numerical values, structures, materials, substrates, source materials, processes, for example, can be used.

More specifically, for example, in the first, second, third and fourth embodiments, the a-Si film stacked by sputtering not using H2 gas can be hydrogenated later to form an a-Si:H film.

As described above, according to the semiconductor device proposed by the invention, since granular products as large as and beyond 3 nm in diameter are not contained substantially at the boundary between the oxide electrode film and the semiconductor thin film, adherence of these films is enhanced, and even if the base body curves or warps after deposition of semiconductor thin films, separation of semiconductor thin films from the base body can be prevented. Thereby, it is possible to realize a semiconductor device such as flexible thin-film solar battery, which uses a general-purpose plastic as its base body.

What is claimed is:

1. A thin film photovoltaic device comprising:
    a base body made of transparent organic high polymer material;
    a transparent oxide electrode film on said base body; and
    a hydrogenated amorphous semiconductor thin film on said oxide electrode film, which thin film contains at least one kind of group IV elements,
        wherein the boundary between said oxide electrode film and said semiconductor thin film is substantially free of granular products having a diameter of 3 nm or greater.

2. The photovoltaic device according to claim 1 wherein the boundary between said oxide electrode film and said semiconductor thin film is substantially free of granular products having a diameter of 1 nm of greater.

3. The thin film photovoltaic device according to claim 1 wherein said oxide electrode film is made of ITO, tin oxide, tin oxide doped with fluoric acid, zinc oxide or zinc oxide-aluminum oxide.

4. The thin film photovoltaic device according to claim 1 wherein part of said semiconductor thin film near the boundary between said oxide electrode film and said semiconductor thin film is stacked in a non-reducing atmosphere.

5. The thin film photovoltaic device according to claim 1 wherein part of said semiconductor thin film near the boundary between said oxide electrode film and said semiconductor thin film is stacked in an atmosphere not containing hydrogen gas.

6. The thin film photovoltaic device according to claim 1 wherein part of said semiconductor thin film near the boundary between said oxide electrode film and said semiconductor thin film is stacked by sputtering not using hydrogen gas.

7. The thin film photovoltaic device according to claim 1 wherein part of said semiconductor thin film near the boundary between said oxide electrode film and said semiconductor thin film is stacked in an atmosphere not containing hydrogen gas, and at least a part of the other part of said semiconductor thin film is stacked by plasma-enhanced chemical vapor deposition.

8. The thin film photovoltaic device according to claim 1 wherein said semiconductor thin film is made of amorphous silicon hydride, amorphous germanium hydride, amorphous silicon germanium hydride or amorphous silicon carbide hydride.

9. The thin film photovoltaic device according to claim 1 wherein said semiconductor device is a thin-film solar battery.

10. A thin film photovoltaic device comprising:
    a base body made of transparent organic high polymer material;
    a transparent oxide electrode film on said base body; and
    a hydrogenated amorphous semiconductor thin film on said oxide electrode film, which thin film contains at least one kind of group IV elements,
        wherein said semiconductor thin film is stacked in a non-reducing atmosphere in an initial period of deposition thereof.

11. The thin film photovoltaic device according to claim 10 wherein said oxide electrode film is made of ITO, tin oxide, tin oxide doped with fluoric acid, zinc oxide or zinc oxide-aluminum oxide.

12. The thin film photovoltaic device according to claim 10 wherein part of said semiconductor thin film near the boundary between said oxide electrode film and said semiconductor thin film is stacked in a non-reducing atmosphere.

13. The thin film photovoltaic device according to claim 10 wherein part of said semiconductor thin film near the boundary between said oxide electrode film and said semiconductor thin film is stacked in an atmosphere not containing hydrogen gas.

14. A thin film photovoltaic device comprising:
    a base body made of transparent organic high polymer material;
    a transparent oxide electrode film on said base body; and
    a hydrogenated amorphous semiconductor thin film on said oxide electrode film,
    wherein,
        the semiconductor thin film contains at least one kind of group IV elements;
        a part of the semiconductor thin film near the boundary between the oxide electrode film and the semiconductor thin film is stacked in an atmosphere not containing hydrogen gas; and
        at least a part of the other part of said semiconductor thin film is stacked by plasma-enhanced chemical vapor deposition.

15. The thin film photovoltaic device according to claim 14 wherein part of said semiconductor thin film near the boundary between said oxide electrode film and said semiconductor thin film is stacked by sputtering not using hydrogen gas.

16. The thin film photovoltaic device according to claim 14 wherein said semiconductor thin film is made of amorphous silicon hydride, amorphous germanium hydride, amorphous silicon germanium hydride or amorphous silicon carbide hydride.

17. The thin film photovoltaic device according to claim 14 wherein said semiconductor device is a thin-film solar battery.

* * * * *